(12) United States Patent
Adachi

(10) Patent No.: US 7,420,214 B2
(45) Date of Patent: Sep. 2, 2008

(54) ARRAY SUBSTRATE FOR DISPLAY DEVICE

(75) Inventor: Noriyuki Adachi, Fukaya (JP)

(73) Assignee: Toshiba Matsushita Display Technology Co., Ltd., Tokyo (JP)

( * ) Notice: Subject to any disclaimer, the term of this patent is extended or adjusted under 35 U.S.C. 154(b) by 0 days.

(21) Appl. No.: 11/724,250

(22) Filed: Mar. 15, 2007

(65) Prior Publication Data

US 2008/0012021 A1    Jan. 17, 2008

(30) Foreign Application Priority Data

Mar. 17, 2006  (JP) .............................. 2006-074584

(51) Int. Cl.
*H01L 29/15* (2006.01)

(52) U.S. Cl. ............................ 257/72; 257/59; 257/228; 257/E29.283; 257/E29.295

(58) Field of Classification Search ................... 257/72, 257/E29.283
See application file for complete search history.

(56) References Cited

U.S. PATENT DOCUMENTS 7,132,789 B2 * 11/2006 Kobayashi ................... 313/504

FOREIGN PATENT DOCUMENTS

JP    11-163353    6/1999

* cited by examiner

*Primary Examiner*—Tu-Tu V Ho
(74) *Attorney, Agent, or Firm*—Finnegan, Henderson, Farabow, Garrett & Dunner, L.L.P.

(57) ABSTRACT

An array substrate for a display device includes an insulating substrate, a buffer layer which is disposed on the insulating substrate and is formed of silicon oxide with a refractive index equal to a refractive index of the insulating substrate, a first insulation layer which is disposed on the buffer layer and formed of silicon nitride, a second insulation layer which is disposed on the first insulation layer and formed of silicon oxide, a switching element including a semiconductor layer disposed on the second insulation layer, and a pixel electrode connected to the switching element.

4 Claims, 3 Drawing Sheets

ARRAY SUBSTRATE FOR DISPLAY DEVICE

CROSS-REFERENCE TO RELATED APPLICATIONS

This application is based upon and claims the benefit of priority from prior Japanese Patent Application No. 2006-074584, filed Mar. 17, 2006, the entire contents of which are incorporated herein by reference.

BACKGROUND OF THE INVENTION

1. Field of the Invention

The present invention relates generally to an array substrate for a display device, and more particularly to the structure of an undercoat layer between an insulating substrate and a semiconductor layer.

2. Description of the Related Art

An array substrate, which is applied to an active-matrix flat-panel display device such as a liquid crystal display device or an organic electroluminescence display device, includes switching elements which are disposed in matrix-arrayed pixels. For example, in a case where a top-gate type thin-film transistor, which includes a semiconductor layer formed of amorphous silicon or polysilicon, is applied to the switching element, an undercoat layer is disposed between an insulating substrate and the semiconductor layer.

As is disclosed in Jpn. Pat. Appln. KOKAI Publication No. 11-163353, for instance, the undercoat layer, in usual cases, adopts a double-layer structure in which a silicon nitride ($Si_3N_4$) film on the insulating substrate and a silicon oxide ($SiO_2$) film on the silicon nitride film are stacked. The semiconductor layer is disposed on the silicon oxide film.

In the process of fabricating the array substrate, it is possible that dust adheres to the insulating substrate or particles may mix in a step of forming the undercoat layer and semiconductor layer. In the case where the undercoat layer of the above-described double-layer structure is adopted, it is possible that a cleaning agent may permeate in foreign matter such as dust or particles in a cleaning process step which follows the formation of the semiconductor layer. In particular, in the case where hydrogen fluoride (HF) is used as a cleaning agent, foreign matter is dissolved and a void occurs. In worst cases, even the insulating substrate is etched, leading to deterioration in manufacturing yield.

The layer undercoat layer of the double-layer structure is formed of, e.g. a silicon nitride film with a thickness of 50 nm and a silicon oxide film with a thickness of 100 nm. In the case where a semiconductor layer with a thickness of about 50 nm is disposed on the undercoat layer, if foreign matter of a sub-micron level is present, it is difficult to completely cover the foreign matter with these films. In addition, if the thicknesses of the silicon nitride film and silicon oxide film are simply increased, deterioration may occur in optical characteristics of the display device, such as transmittance and chromaticity. Thus, the thicknesses of these films are set in a limited range.

BRIEF SUMMARY OF THE INVENTION

The present invention has been made in consideration of the above-described problem, and the object of the invention is to provide an array substrate for a display device which can suppress a decrease in manufacturing yield while suppressing deterioration in optical characteristics.

According to an aspect of the present invention, there is provided an array substrate for a display device, comprising: an insulating substrate; a buffer layer which is disposed on the insulating substrate and is formed of silicon oxide with a refractive index equal to a refractive index of the insulating substrate; a first insulation layer which is disposed on the buffer layer and formed of silicon nitride; a second insulation layer which is disposed on the first insulation layer and formed of silicon oxide; a switching element including a semiconductor layer disposed on the second insulation layer; and a pixel electrode connected to the switching element.

The present invention can provide an array substrate for a display device which can suppress a decrease in manufacturing yield while suppressing deterioration in optical characteristics.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

An array substrate for a display device according to an embodiment of the present invention is described with reference to the accompanying drawings.

To begin with, the structure of the array substrate according to the embodiment is described. The structure of the array substrate, which is applied to a liquid crystal display device as an active-matrix flat-panel display device, is described.

Figure 1:
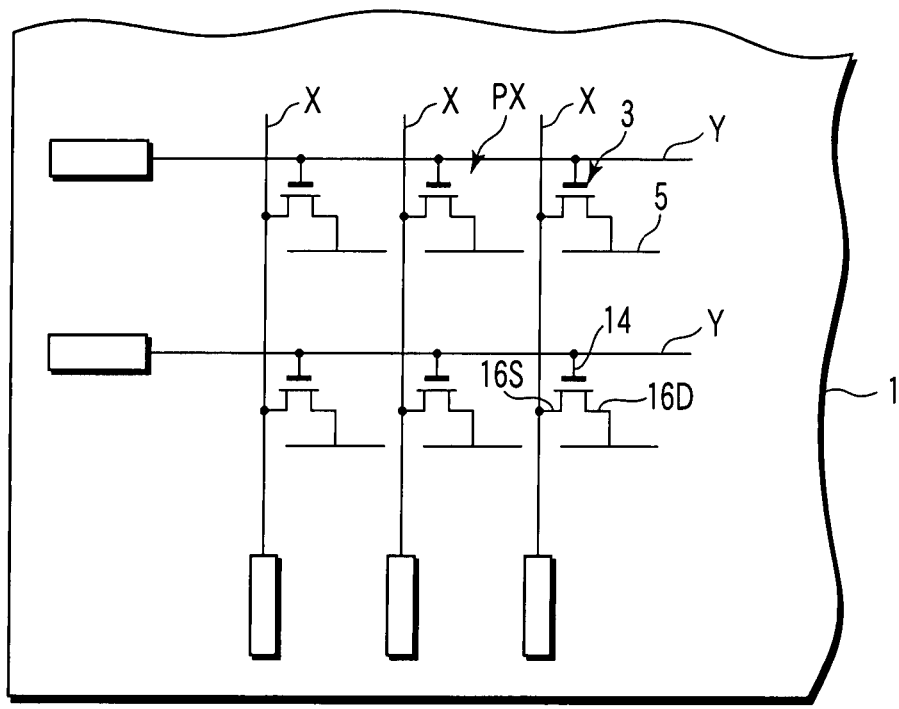
FIG. 1 schematically shows the structure of an array substrate according to an embodiment of the present invention.

As is shown in FIG. 1, an array substrate 1 includes a plurality of pixels PX which are arrayed in a matrix. The array substrate 1 includes a plurality of scanning lines Y, which extend in a row direction of the pixels PX, and a plurality of signal lines X which extend in a column direction of the pixels PX. The scanning lines Y and signal lines X are arranged via an insulation layer and are mutually insulated. The array substrate 1 includes switching elements 3, which are disposed in the respective pixels PX in regions including intersections between the scanning lines Y and signal lines X, and pixel electrodes 5 which are electrically connected to the switching elements 3. Scanning signals for controlling turning-on/off of the switching elements 3 are supplied to the scanning lines Y. Video signals are supplied to the signal lines X.

Each of the switching elements 3 is composed of, e.g. a top-gate type thin-film transistor (pixel transistor) which includes a semiconductor layer formed of polysilicon (p-Si) as polycrystalline semiconductor. A gate electrode 14 of the switching element 3 is electrically connected to the associated scanning line Y (or formed integral with the scanning line). A source electrode 16S of the switching element 3 is electrically connected to the associated signal line X (or formed integral with the signal line). A drain electrode 16D of the switching element 3 is electrically connected to a pixel electrode 5 of the associated pixel PX (or formed integral with the pixel electrode).

Figure 2:
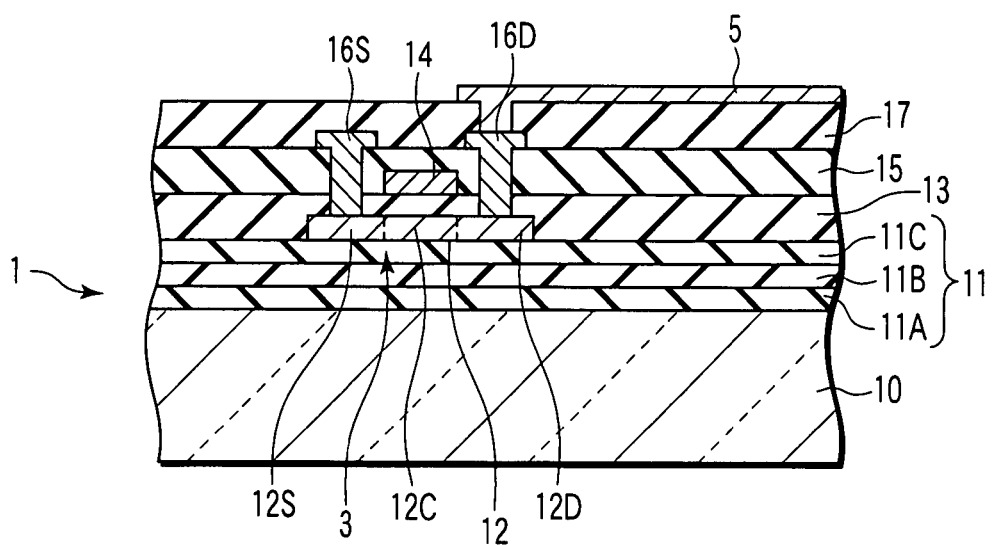
FIG. 2 schematically shows a cross-sectional structure of the array substrate shown in FIG. 1.

As is shown in FIG. 2, the array substrate 1 is formed by using a light-transmissive insulating substrate 10. The insulating substrate 10 is formed of, e.g. glass. An undercoat layer 11 is disposed on the insulating substrate 10. The undercoat layer 11 is formed by stacking at least three insulation layers.

Specifically, the undercoat layer 11 includes a buffer layer 11A which is disposed on the insulating substrate 10, a first insulation layer 11B which is disposed on the buffer layer 11A, and a second insulation layer 11C which is disposed on the first insulation layer 11B. The buffer layer 11A is formed of a material having a refractive index which is equal to the refractive index of the insulating substrate 10. For example, in the case where the insulating substrate 10 is a glass substrate, the buffer layer 11A is formed of a material with a refractive index which is so adjusted in a range of 1.45 to 1.59 (preferably about 1.52) as to be equal to the refractive index of glass. Preferably, the buffer layer 11A is formed of silicon oxide ($SiO_2$). The first insulation layer 11B is formed of, e.g. silicon nitride ($Si_3N_4$). The second insulation layer 11C is formed of, e.g. silicon oxide ($SiO_2$). The undercoat layer 11 can be formed by, e.g. sputtering or CVD. In this embodiment, the thickness of the buffer layer 11A is 300 nm, the thickness of the first insulation layer 11B is 50 nm, and the thickness of the second insulation layer 11C is 100 nm.

A polysilicon semiconductor layer 12, which constitutes the switching element 3, is disposed on the second insulation layer 11C that is included in the undercoat layer 11 having the above-described structure. In this embodiment, the thickness of the polysilicon semiconductor layer 12 is 49 nm. The semiconductor layer 12 includes a source region 12S and a drain region 12D, between which a channel region 12C is interposed. The semiconductor layer 12 is covered with a gate insulation film 13. The gate insulation film 13 is formed of, e.g. TEOS (Tetra Ethyl Ortho Silicate).

A gate electrode 14 of the switching element 3 is disposed on the gate insulation film 13. The gate electrode 14 is formed of, e.g. molybdenum-tungsten (MoW). The gate electrode 14 is covered with an interlayer insulation film 15. The interlayer insulation film 15 is formed of, e.g. silicon nitride (SiNx).

A source electrode 16S and a drain electrode 16D of the switching element 3 are disposed on the interlayer insulation film 15 on both sides of the gate electrode 14. The source electrode 16S and drain electrode 16D are formed of, e.g. a stacked structure of molybdenum (Mo)/aluminum-neodymium (AlNd)/molybdenum (Mo). The source electrode 16S is put in contact with the source region 12S of the semiconductor layer 12 via a contact hole which penetrates the gate insulation film 13 and interlayer insulation film 15. The drain electrode 16D is put in contact with the drain region 12D of the semiconductor layer 12 via a contact hole which penetrates the gate insulation film 13 and interlayer insulation film 15. The source electrode 16S and drain electrode 16D are covered with a passivation film 17. The passivation film 17 is formed of, e.g. silicon oxide ($SiO_2$).

The pixel electrode 5 is disposed on the passivation film 17. The pixel electrode 5 is connected to the drain electrode 16D via a contact hole which penetrates the passivation film 17. In a transmissive liquid crystal display device which selectively passes backlight from a backlight unit, which is disposed on the back side of the array substrate 1, thereby displaying an image, the pixel electrode 5 is formed of a light-transmissive, electrically conductive material such as indium tin oxide (ITO) or indium zinc oxide (IZO). In a reflective liquid crystal display device which selectively reflects light from a front-light unit, which is disposed on the front side of the array substrate 1, or ambient light, thereby displaying an image, the pixel electrode 5 is formed of a light-reflective, electrically conductive material such as aluminum. In the array substrate 1 of the liquid crystal display device, the pixel electrode 5 is covered with an alignment film which controls alignment of liquid crystal molecules.

According to the array substrate with the above-described structure, the buffer layer having the same refractive index as the insulating substrate is disposed on the surface of the insulating substrate. Thereby, when the array substrate is applied to the display device, it becomes possible to suppress the effect on the optical characteristics of the display device and to increase the thickness of the entire undercoat layer. Thus, even if sub-micron-level foreign matter mixes in the fabrication process, it becomes possible to cover the foreign matter with the whole undercoat layer. Thus, unwanted etching of the insulating substrate due to permeation of a cleaning agent via the foreign matter can be suppressed. Therefore, a decrease in manufacturing yield can be suppressed.

As the thickness of the whole undercoat layer, which has been described above, is increased, the occurrence of a defect due to foreign matter can be suppressed more effectively. In particular, since the buffer layer 11A that is disposed on the insulating substrate 10 has the same refractive index as the insulating substrate 10, the optical characteristics are less affected. Thus, the thickness of the buffer layer 11A can freely be set. Specifically, even if the thickness of the buffer layer 11A is increased, the optical characteristics are less affected. Thus, when the thickness of the whole undercoat layer is to be increased, it is preferable to adjust the thickness of the undercoat layer by the thickness of the buffer layer 11A. According to the inventor's study, it was confirmed that there was no particular influence on optical characteristics in the case where the buffer layer 11A having a thickness in the range of 100 nm to 500 nm was applied.

Next, a description is given of the structure of a liquid crystal display device, which is an example of the display device including the array substrate 1 with the above-described structure.

Figure 5:
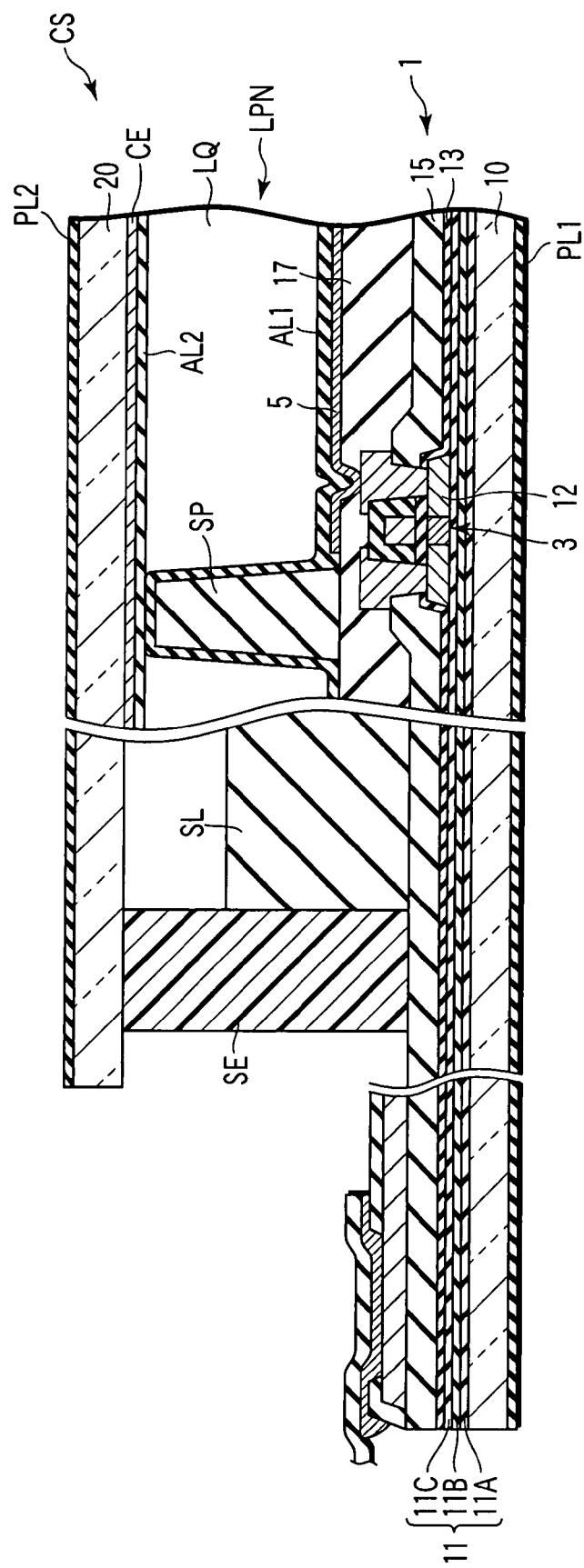
FIG. 5 is a view for explaining an example of the structure of a liquid crystal display device to which the array substrate shown in FIG. 2 is applied.

As is shown in FIG. 5, the liquid crystal display device includes a liquid crystal panel LPN. The liquid crystal panel LPN includes the array substrate 1 with the above-described structure, a counter-substrate CS, and a liquid crystal layer LQ which is held between the array substrate 1 and counter-substrate CS via alignment films.

The array substrate 1, as described above, includes the undercoat layer 11 with the triple-layer structure provided on one major surface (front surface) of the insulating substrate 10, the switching element 3 that is composed of the thin-film transistor including the polysilicon semiconductor layer 12, and the pixel electrode 5 that is connected to the switching element 3. The surface of the pixel electrode 5 is covered with an alignment film AL1.

The counter-substrate CS includes a counter-electrode CE which is disposed on one major surface (front surface) of a light-transmissive insulating substrate 20 such as a glass substrate, and is opposed to the pixel electrode 5. The counter-electrode CE is formed of a light-transmissive, electrically conductive material such as ITO. The surface of the counter-electrode CE is covered with an alignment film AL2.

A columnar spacer SP for providing a predetermined gap is disposed between the array substrate 1 and counter-substrate CS. The columnar spacer SP is formed, for example, of a resin on the array substrate 1. In the array substrate 1, a light shield layer SL is disposed in a picture-frame shape on the outside of an active area for displaying an image. The light shield layer SL is formed of a resin with a light shield property. For example, the light shield layer SL is formed of the same resin as the columnar spacer SP.

In the state in which the predetermined gap is provided by the columnar spacer SP, the array substrate 1 and counter-substrate CS are attached to each other by a sealing material SE. In addition, in the liquid crystal panel LPN, a pair of polarizer plates PL1 and PL2, whose polarization directions are set in accordance with the characteristics of the liquid crystal layer LQ, are disposed on outer surfaces of the array substrate 1 and counter-substrate CS.

According to the liquid crystal display device to which the array substrate 1 with the above-described structure is applied, no deterioration was confirmed in the optical characteristics due to the addition of the buffer layer 11A. On the other hand, the occurrence of bright spot defective pixels and dark spot defective pixels due to mixing of foreign matter was suppressed, and the manufacturing yield was improved.

As regards an array substrate in which an undercoat layer with a double-layer stacked structure of a silicon nitride film/silicon oxide film is disposed on an insulating substrate, the relationship between the transmittance and the thickness of the silicon oxide film included in the undercoat layer was measured. The insulating substrate was formed of a glass substrate, and the thickness of the silicon nitride film of the undercoat layer was set at 20 nm. The thickness of the gate insulation film (TEOS) 13 was set at 100 nm, and the thickness of the interlayer insulation film (SiNx) 15 was set at 275 nm, and the thickness of the passivation film ($SiO_2$) 17 was set at 350 nm. The transmittance was measured by using a luminance meter (BM7 manufactured by FUJIFILM Corporation) and a light-box light source as a light source.

Figure 3:
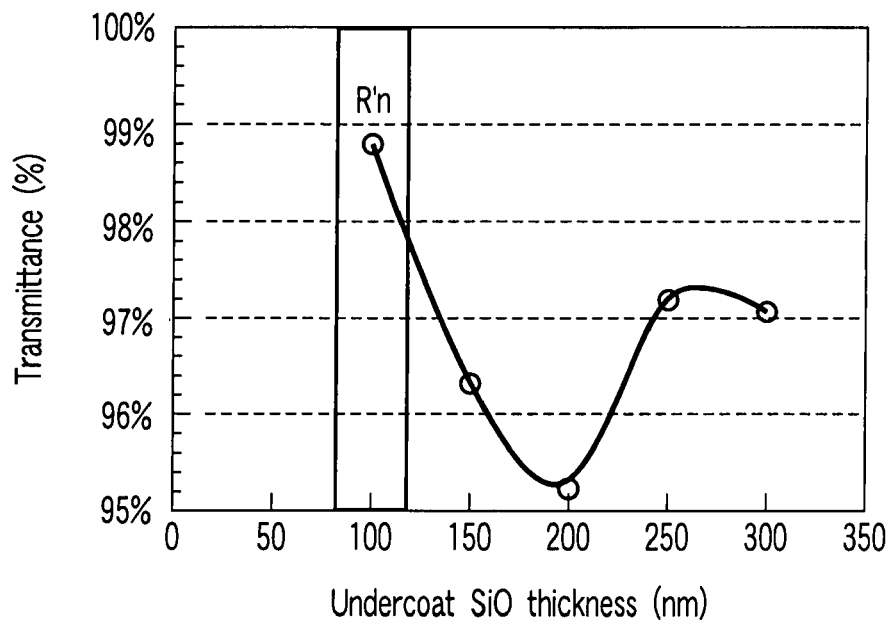
FIG. 3 is a graph for explaining the relationship between transmittance and a thickness of a silicon oxide film of an array substrate to which an undercoat layer of a double-layer structure is applied.

As is shown in FIG. 3, it was confirmed that the transmittance tends to decrease as the film thickness increases, with a reference point set at 100 nm of the thickness of the silicon oxide film of the undercoat layer. In addition, it was confirmed that with an increase in film thickness from the reference point, various optical characteristics, such as chromaticity, gradation and viewing angle characteristics, tend to deteriorate. In short, it was confirmed that in the undercoat layer with the double-layer structure, in the case where the whole film thickness was simply increased, the display quality was affected.

On the other hand, as regards the array substrate in which the undercoat layer 11 of the triple-layer stacked structure comprising the buffer layer 11A/first insulation layer 11B/second insulation layer 11C is disposed on the insulating substrate 10, as in the present embodiment, the relationship between the transmittance and the thickness of the buffer layer 11A was measured. The insulating substrate 10 was formed of a glass substrate, the buffer layer 11A was a silicon oxide film having the same refractive index as the glass substrate, the first insulation film 11B was a silicon nitride film with a thickness of 20 nm, and the second insulation layer was a silicon oxide film with a thickness of 100 nm. The thickness of the gate insulation film (TEOS) 13 was set at 100 nm, the thickness of the interlayer insulation film (SiNx) 15 was set at 275 nm, and the thickness of the passivation film ($SiO_2$) 17 was set at 350 nm. The transmittance was measured in the same manner as described above.

Figure 4:
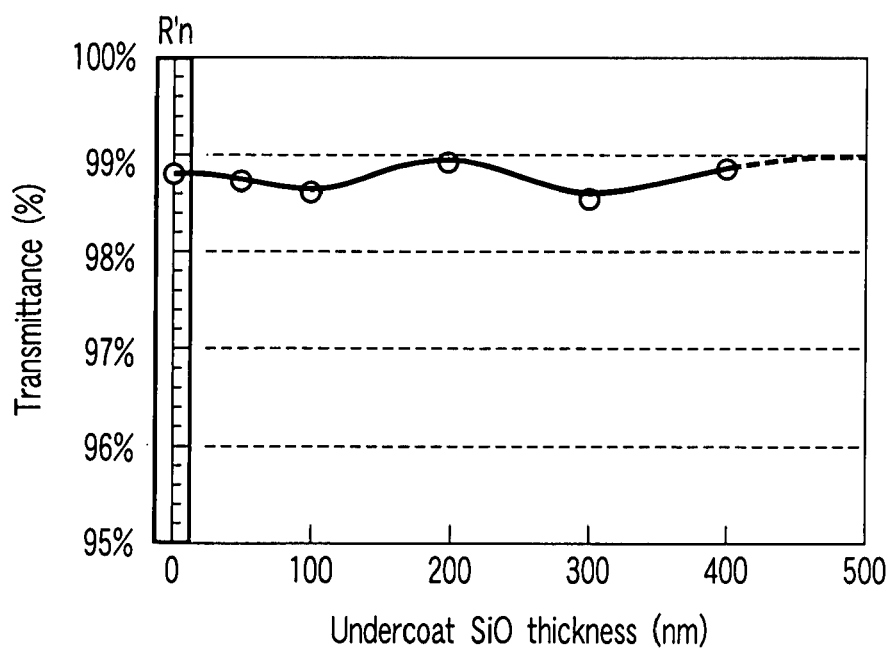
FIG. 4 is a graph for explaining the relationship between transmittance and a thickness of a silicon oxide film of an array substrate to which an undercoat layer of a triple-layer structure is applied.

As is shown in FIG. 4, if a reference point is set at 0 of the thickness of the buffer layer 11A, even when the thickness of the buffer layer was 400 nm, the same transmittance as the transmittance at the reference point was obtained. In addition, no considerable deterioration occurred in various optical characteristics, such as chromaticity, gradation and viewing angle characteristics, due to an increase in film thickness, and substantially the same characteristics as those at the reference point were obtained. Specifically, according to the undercoat layer of the triple-layer structure in which the buffer layer having the same refractive index as the insulating substrate is disposed on the surface of the insulating substrate, it was confirmed that even if the thickness of the buffer layer is increased and the thickness of the whole undercoat layer is increased, the effect on the display quality is suppressed to a minimum. Therefore, the thickness of the whole undercoat layer can freely be set by the thickness of the buffer layer.

In order to completely cover sub-micron-level foreign matter, it is desirable that the thickness of the buffer layer is at least 100 nm. However, if an excessively thick buffer layer is to be formed, a long time is needed for forming the buffer layer, and productivity may deteriorate. Thus, the thickness of the buffer layer should preferably be set at 500 nm or less, and more preferably at 300 nm or less.

Next, as regards array substrates to which the undercoat layer of the triple-layer structure is applied, manufacturing yields were compared.

Specifically, as regards array substrates including buffer layers with thicknesses of 100 nm, 300 nm and 500 nm, respectively, the manufacturing yields of these array substrates were compared with a reference (i.e. an array substrate including a buffer layer with a thickness of 0). In each case, a manufacturing yield higher than the manufacturing yield of the reference was obtained. In particular, when the thickness of the buffer layer was 300 nm, a high manufacturing yield was obtained, and an improvement of 14.5%, compared to the reference, was confirmed.

The effect of eliminating spot defects was examined. The spot defects include a bright spot defect by which an associated pixel is always turned on due to foreign matter, and a dark spot defect by which an associated pixel is always turned off due to foreign matter. The manufacturing ratio of display panels with no bright spot defective pixel is +7.6% when the thickness of the buffer layer is 100 nm, relative to the reference (the case in which the thickness of the buffer layer is zero), and is +7.3% when the thickness of the buffer layer is 300 nm, relative to the reference. The manufacturing ratio of display panels with no dark spot defective pixel is +2.7% when the thickness of the buffer layer is 100 nm, relative to the reference, and is +1.6% when the thickness of the buffer layer is 300 nm, relative to the reference.

As has been described above, the array substrate according to the present embodiment includes the undercoat layer with the triple-layer structure comprising the buffer layer, which has the same refractive index as the insulating substrate and is disposed on the surface of the insulating substrate, and the first insulation film and second insulation film which are successively stacked on the buffer layer. It is thus possible to increase the manufacturing yield without affecting the optical characteristics.

The present invention is not limited directly to the above-described embodiment. In practice, the structural elements can be modified without departing from the spirit of the invention. Various inventions can be made by properly combining the structural elements disclosed in the embodiment. For example, some structural elements may be omitted from all the structural elements disclosed in the embodiment. Furthermore, structural elements in different embodiments may properly be combined.

For example, in the above-described embodiment, the array substrate that is applied to the liquid crystal display device has been described. The above-described structure of the array substrate, however, is also applicable to array substrates of other types of flat-panel display devices such as an organic electroluminescence display device.

What is claimed is:

1. An array substrate for a display device, comprising:
   an insulating substrate;
   a buffer layer which is disposed on the insulating substrate and is formed of silicon oxide with a refractive index equal to a refractive index of the insulating substrate;
   a first insulation layer which is disposed on the buffer layer and formed of silicon nitride;
   a second insulation layer which is disposed on the first insulation layer and formed of silicon oxide;
   a switching element including a semiconductor layer disposed on the second insulation layer; and
   a pixel electrode connected to the switching element.

2. The array substrate according to claim 1, wherein the refractive index of the silicon oxide, of which the buffer layer is formed, is in a range of 1.45 to 1.59.

3. The array substrate according to claim 1, wherein a thickness of the buffer layer is in a range of 100 nm to 500 nm.

4. The array substrate according to claim 1, wherein the switching element is a thin-film transistor including a semiconductor layer which is formed of polysilicon.

* * * * *